US012666880B2

(12) United States Patent
van der Straten et al.

(10) Patent No.: US 12,666,880 B2
(45) Date of Patent: Jun. 23, 2026

(54) MRAM BOTTOM ELECTRODE SHROUD

(71) Applicant: International Business Machines Corporation, Armonk, NY (US)

(72) Inventors: Oscar van der Straten, Guilderland Center, NY (US); Koichi Motoyama, Clifton Park, NY (US); Kenneth Chun Kuen Cheng, Shatin (HK); Joseph F. Maniscalco, Greenville, SC (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 741 days.

(21) Appl. No.: 17/452,807

(22) Filed: Oct. 29, 2021

(65) Prior Publication Data

US 2023/0137421 A1 May 4, 2023

(51) Int. Cl.
| | |
|---|---|
| *H10N 50/80* | (2023.01) |
| *H10B 61/00* | (2023.01) |
| *H10N 50/01* | (2023.01) |

(52) U.S. Cl.
CPC ............. *H10N 50/80* (2023.02); *H10B 61/00* (2023.02); *H10N 50/01* (2023.02)

(58) Field of Classification Search
CPC ........ H10N 50/80; H10N 50/01; H10N 50/10; H10B 61/00; H10B 61/22
See application file for complete search history.

(56) References Cited

U.S. PATENT DOCUMENTS

| | | | |
|---|---|---|---|
| 9,559,294 B2 | 1/2017 | Hsu et al. | |
| 10,727,398 B1 | 7/2020 | Marchack et al. | |
| 10,840,433 B2 | 11/2020 | Hashemi et al. | |
| 10,892,403 B2 | 1/2021 | Marchack et al. | |
| 10,957,738 B2 | 3/2021 | Hashemi et al. | |
| 2009/0209050 A1 | 8/2009 | Wang et al. | |
| 2011/0049655 A1 | 3/2011 | Assefa et al. | |
| 2019/0043795 A1* | 2/2019 | Chen ..................... | H01L 23/498 |
| 2020/0083288 A1* | 3/2020 | Kanaya ............... | G11C 11/1655 |
| 2020/0220072 A1* | 7/2020 | Marchack ............. | H10B 61/00 |
| 2020/0243756 A1 | 7/2020 | Marchack et al. | |
| 2021/0066581 A1 | 3/2021 | Doris et al. | |
| 2021/0074766 A1* | 3/2021 | Pillarisetty ......... | G11C 13/0002 |
| 2021/0202511 A1* | 7/2021 | Yeong ................... | H10D 1/692 |

* cited by examiner

*Primary Examiner* — Fernando L Toledo
*Assistant Examiner* — Marshall Mu-Nuo Hatfield
(74) *Attorney, Agent, or Firm* — Seed Intellectual Property Law Group LLP

(57) ABSTRACT

A memory device includes a bottom electrode having an uppermost surface, a first sidewall, and a second sidewall. The memory device further includes a dielectric layer covering the uppermost surface and the first and second sidewalls of the bottom electrode such that an uppermost surface of the dielectric layer is arranged higher than the uppermost surface of the bottom electrode. The memory device further includes a metal body in direct contact with the uppermost surface of the bottom electrode and extending through the dielectric layer to the uppermost surface of the dielectric layer. The memory device further includes a memory component arranged in direct contact with the metal body and with the uppermost surface of the dielectric layer.

14 Claims, 13 Drawing Sheets

200

MRAM BOTTOM ELECTRODE SHROUD

BACKGROUND

The present disclosure relates to the electrical, electronic, and computer fields. In particular, the present disclosure relates to computer memory devices and methods of making computer memory devices.

Random-access memory (RAM) is a form of computer memory that can be read and changed. RAM is typically used to store working data and machine code. Non-volatile random-access memory (NVRAM) is RAM that retains data without applied power. Magnetoresistive random-access memory (MRAM) is a type of NVRAM which stores data in magnetic domains.

SUMMARY

Embodiments of the present disclosure include a memory device. The memory device includes a bottom electrode having an uppermost surface, a first sidewall, and a second sidewall. The memory device further includes a dielectric layer covering the uppermost surface and the first and second sidewalls of the bottom electrode such that an uppermost surface of the dielectric layer is arranged higher than the uppermost surface of the bottom electrode. The memory device further includes a metal body in direct contact with the uppermost surface of the bottom electrode and extending through the dielectric layer to the uppermost surface of the dielectric layer. The memory device further includes a memory component arranged in direct contact with the metal body and with the uppermost surface of the dielectric layer.

Additional embodiments of the present disclosure include a method of making a memory device. The method includes forming a bottom electrode having an uppermost surface, a first sidewall, and a second sidewall. The method further includes forming a dielectric layer covering the uppermost surface and the first and second sidewalls of the bottom electrode such that an uppermost surface of the dielectric layer is arranged higher than the uppermost surface of the bottom electrode. The method further includes forming a metal body in direct contact with the uppermost surface of the bottom electrode and extending through the dielectric layer. The memory further includes forming a memory component in direct contact with the metal body and with the uppermost surface of the dielectric layer.

Additional embodiments of the present disclosure include a method of making a memory device. The method includes forming a bottom electrode having an uppermost surface, a first sidewall, and a second sidewall. The method further includes recessing lateral areas of the bottom electrode adjacent to the first and second sidewalls such that each lateral area has an uppermost surface that is lower than the uppermost surface of the bottom electrode. The method further includes forming a dielectric layer covering the uppermost surface and the first and second sidewalls of the bottom electrode such that an uppermost surface of the dielectric layer is arranged higher than the uppermost surfaces of the lateral area and is substantially coplanar with the uppermost surface of the bottom electrode. The method further includes forming a memory component in direct contact with the uppermost surface of the bottom electrode such that the dielectric layer is interposed between the memory component and the lateral areas of the bottom electrode.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

DETAILED DESCRIPTION

Figure 1:
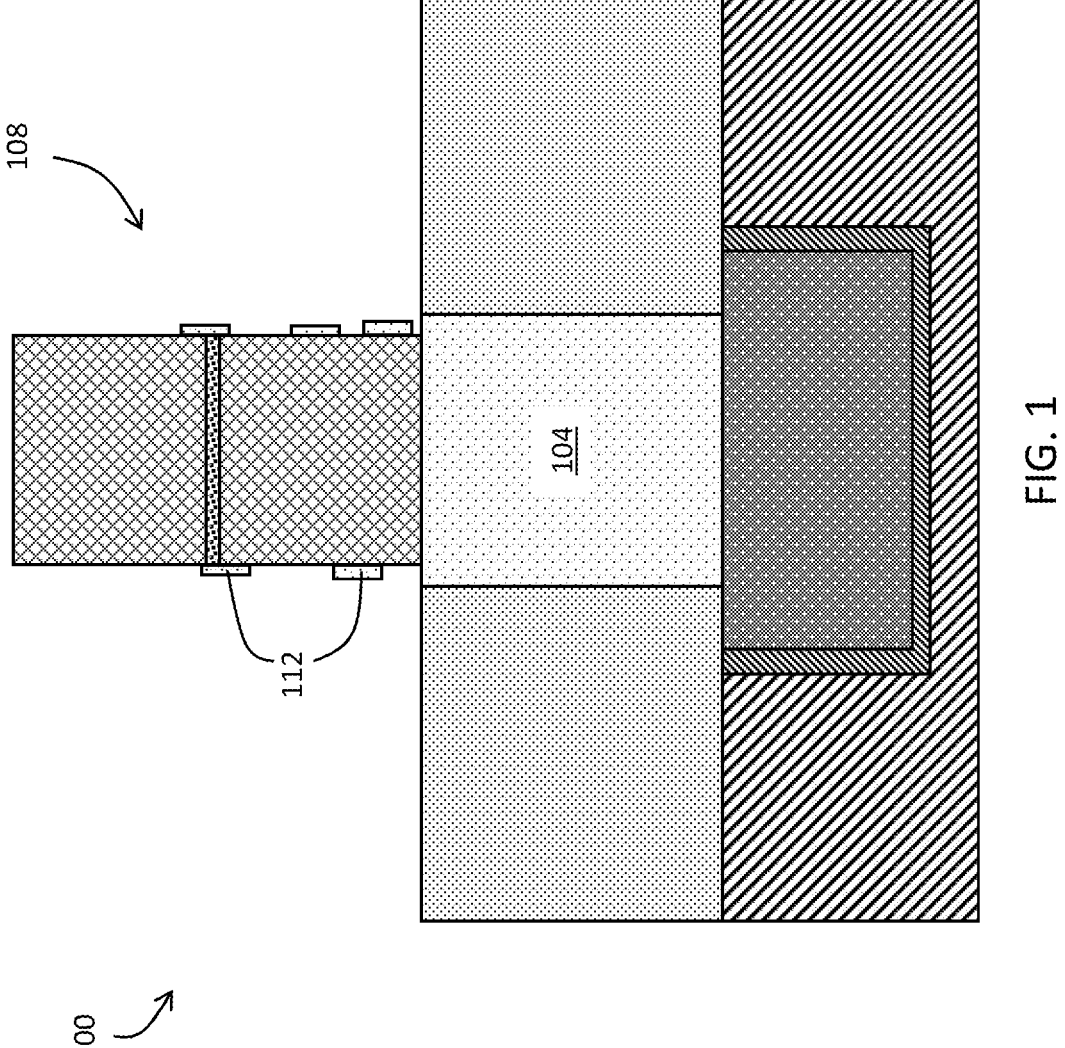
FIG. 1 is a schematic diagram illustrating an example memory device, in accordance with embodiments of the present disclosure.

Aspects of the present disclosure relate generally to the electrical, electronic, and computer fields. In particular, the present disclosure relates to computer memory devices and methods of making computer memory devices. While the present disclosure is not necessarily limited to such applications, various aspects of the disclosure may be appreciated through a discussion of various examples using this context.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

Turning now to an overview of technologies that are more specifically relevant to aspects of the present disclosure, Random-access memory (RAM) is a form of computer memory that can be read and changed. RAM is typically used to store working data and machine code. Non-volatile random-access memory (NVRAM) is RAM that retains data without applied power. Magnetoresistive random-access memory (MRAM) is a type of NVRAM which stores data in magnetic domains.

More specifically, data in MRAM is stored by magnetic storage elements. The elements are formed from two ferromagnetic plates, each of which can hold a magnetization, separated by a thin insulating layer. One of the two plates is a permanent magnet set to a particular polarity. This plate may also be referred to as the reference layer. The other plate's magnetization can be changed to match that of an external field to store memory. This plate may also be referred to as the free layer. The thin insulating layer separating the two may also be referred to as a tunnel barrier layer, because electrons can tunnel through it from one ferromagnetic plate into the other. This configuration is known as a magnetic tunnel junction (MTJ) or an MTJ stack, and it provides the physical structure for an MRAM bit. A memory device is built from a grid of such "cells."

Each such cell is provided with an upper electrical contact and a lower electrical contact so that electrical current can flow through the MTJ. The upper electrical contact may also be referred to as a top electrode, and the lower electrical contact may also be referred to as a bottom electrode. The top and bottom electrodes functionally interconnect and integrate the cell into the memory device.

Well-defined interfaces and interface control are necessary to enable the accuracy and reliability required for high performance MRAM devices based on perpendicular MTJ structures. More specifically, the interfaces between the ferromagnetic plates, the tunnel barrier layer, the top and bottom electrodes, and surrounding dielectric materials must be controlled and well-defined to prevent inadvertent shorts between the layers. The small scale of the structures makes this particularly challenging. For example, the tunnel barrier layer that separates the two ferromagnetic plates may be only a few nanometers thick. Accordingly, even relatively small discrepancies can impact the functionality of the device.

During conventional MRAM and MTJ fabrication processes, the bottom electrode is formed prior to the MTJ stack. In some embodiments, the bottom electrode may be separated from the reference layer of the MTJ by a synthetic anti-ferromagnet (SAF) layer. The SAF layer can be made of a metal material. For example, the SAF layer may be cobalt based. Regardless of whether the memory device includes an SAF layer, the MTJ stack is formed on top of the electrode or the SAF layer by performing a sequence of patterning and etching the MTJ materials. Etching the MTJ materials can include, for example, reactive ion etching (ME) and/or ion beam etching (IBE) processes. However, such processes typically lead to shorting the MTJ stack because the metal (the bottom electrode and/or the SAF layer) underneath the MTJ stack is also impacted by the etching processes, and some of the metal is re-sputtered back onto the sides of the MTJ stack. The re-sputtered metal can short the MRAM device.

As an illustrative example, FIG. 1 depicts an MRAM device 100 including a bottom electrode 104 and an MTJ stack 108. As the MTJ stack 108 undergoes etching procedures to reduce the width of the stack, a portion of the bottom electrode 104 is also incidentally exposed, and subject to the etching procedures. As a result, some of the material of the bottom electrode 104 is re-sputtered onto the sides of the MTJ stack 108. This re-sputtered material re-hardens, forming unintentional areas of metal 112 on the sides of the MTJ stack 108, which can short the device 100.

Embodiments of the present disclosure may overcome these and other drawbacks of existing solutions by forming a shroud of dielectric material between the bottom of the MTJ stack and the underlying metal structures. Such a shroud enables the requisite contact to be formed between the MTJ stack and the underlying metal structures and prevents the underlying metal structures from being impacted by etching procedures, thereby preventing re-sputtering of the metal materials onto the sidewalls of the MTJ stack.

In general, the various processes used to form the structures for a semiconductor chip or micro-chip that will be packaged into an IC fall into three general categories, namely, deposition, removal/etching, and patterning/lithography.

Deposition is any process that grows, coats, or otherwise transfers a material onto the substrate. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the substrate surface that would otherwise require higher temperatures associated with conventional CVD. Energetic ion bombardment during PECVD deposition can also improve the film's electrical and mechanical properties.

Removal/etching is any process that removes material from the substrate. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on substrates. With RIE the plasma is generated under low pressure (vacuum) by an electromagnetic field. High-energy ions from the RIE plasma attack the substrate surface and react with it to remove material.

Patterning/lithography is the formation of three-dimensional relief images or patterns on the semiconductor substrate for subsequent transfer of the pattern to a layer arranged beneath the pattern. In semiconductor lithography, the patterns are formed by a light sensitive polymer called a photoresist.

To build the complex structures that make up a circuit and a semiconductor chip, lithography and etch pattern transfer steps are repeated multiple times. Each pattern being printed on the substrate is aligned to previously formed patterns, and gradually the various conductive and insulative functional regions are built up to form the final device.

Figure 2:
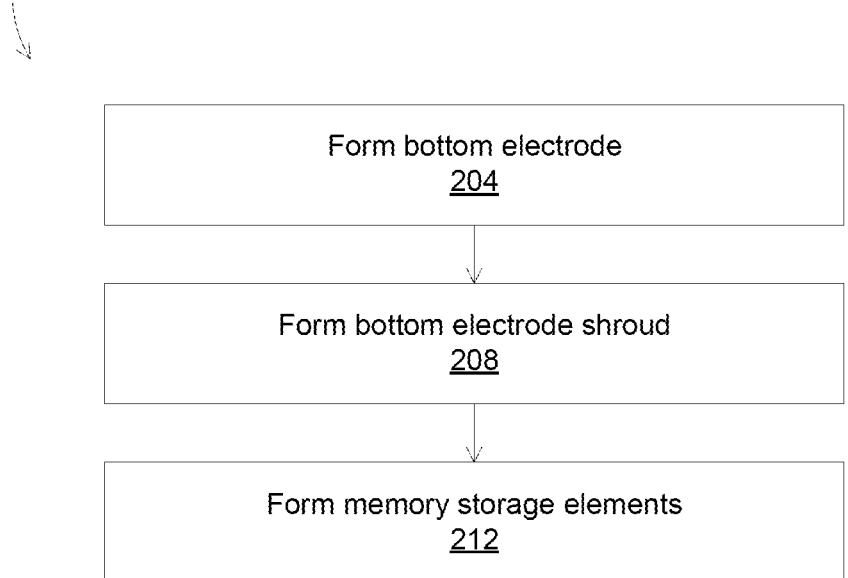
FIG. 2 illustrates a flowchart of an example method for forming a semiconductor component, in accordance with embodiments of the present disclosure.

FIG. 2 depicts a flowchart of an example method 200 for forming a memory device, according to embodiments of the present disclosure. The method 200 begins with operation 204, wherein the bottom electrode is formed. In accordance with at least one embodiment of the present disclosure, the performance of operation 204 further includes the performance of a number of sub-operations.

More specifically, the performance of operation 204 includes forming a bottom electrode on top of a lower level that includes a metal interconnect structure surrounded by dielectric material. In accordance with at least one alternative embodiment, the performance of operation 204 can further include forming the lower level, including forming the metal interconnect structure in the dielectric material.

Regardless of whether the lower level is already formed prior to the performance of operation 204, the metal interconnect structure formed in the lower level is, for example, a line configured to transmit power and/or signal to the bottom electrode. In accordance with at least one embodiment of the present disclosure, forming the bottom electrode can include depositing a layer of electrode material over the entirety of the lower level.

Figures 3A, 3B:
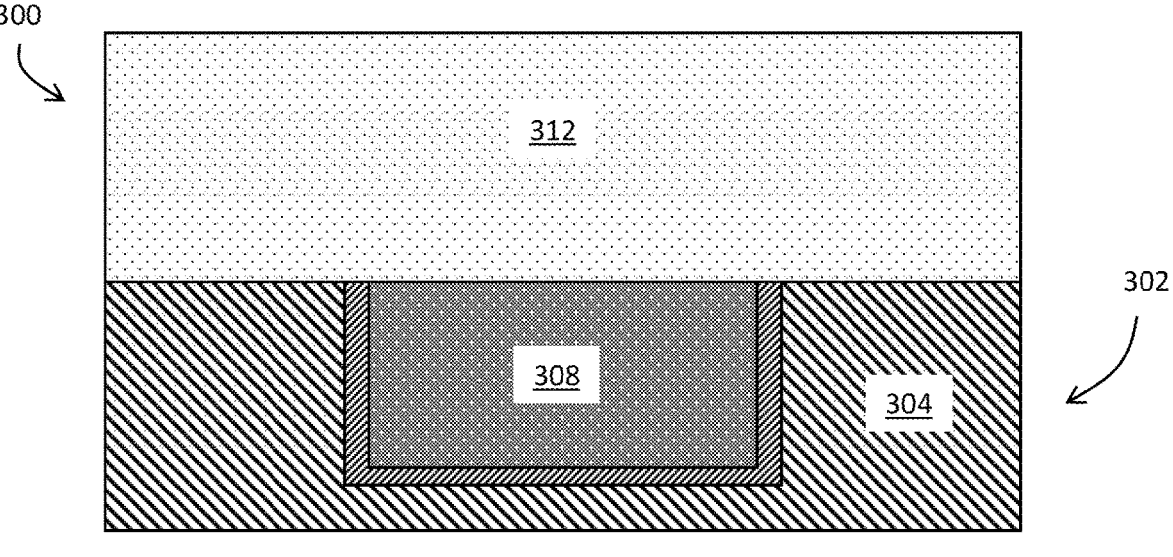
FIG. 3A illustrates an example of a component following the performance of a portion of the example method of FIG. 2, in accordance with embodiments of the present disclosure.
FIG. 3B illustrates an example of a component following the performance of a portion of the example method of FIG. 2, in accordance with embodiments of the present disclosure.

FIG. 3A depicts an illustrative example structure 300 following the performance of the above portion(s) of operation 204. In particular, FIG. 3A depicts a lower level 302 of the structure 300. The lower level 302 includes a first dielectric layer 304 and a lower level line 308 formed in the first dielectric layer 304. Additionally, FIG. 3A depicts a layer of electrode material 312 deposited over the entirety of the lower level 302.

In accordance with at least one embodiment of the present disclosure, the performance of operation 204 further includes selectively patterning and etching the layer of electrode material to remove a portion of the layer of electrode material. The remaining portion of the layer of electrode material will form the bottom electrode. Because the bottom electrode is to receive power and/or signal from the lower level interconnect structure, the bottom electrode is patterned and etched such that the bottom electrode is in direct contact with the metal that forms the interconnect structure of the lower level. The bottom electrode has an uppermost surface, arranged opposite the interconnect structure of the lower level, and sidewalls that extend from the interconnect structure of the lower level up to the uppermost surface. In other words, the uppermost surface of the bottom electrode is spaced apart from the interconnect structure of the lower level by the sidewalls of the bottom electrode.

FIG. 3B depicts the example structure 300 following the performance of this portion of operation 204. Moreover, FIG. 3B depicts the example structure 300 following the performance of the entirety of operation 204. Accordingly, FIG. 3B depicts the example structure 300 following the formation of the bottom electrode.

In particular, in FIG. 3B, the layer of electrode material 312 has been selectively patterned and etched such that the resulting bottom electrode 316 is in direct contact with the lower level line 308. The layer of electrode material 312 has been removed from the remainder of the structure 300, including above the first dielectric layer 304. Accordingly, the bottom electrode 316 has an uppermost surface 317, which is arranged opposite the lower level line 308, and first and second sidewalls 318, 319, which extend from the lower level line 308 to the uppermost surface 317. None of the uppermost surface 317 or the sidewalls 318, 319 of the bottom electrode 316 is in direct contact with the first dielectric layer 304.

Returning to FIG. 2, following the formation of the bottom electrode, the method 200 proceeds with operation 208, wherein a bottom electrode shroud is formed. In accordance with at least one embodiment of the present disclosure, the performance of operation 208 further includes the performance of a number of sub-operations. Additionally, the performance of operation 208 can be achieved by performing more than one distinct group of sub-operations, two of which will be discussed herein. In particular, a first illustrative embodiment of the present disclosure includes performing a first group of sub-operations to form the bottom electrode shroud, and a second illustrative embodiment of the present disclosure includes performing a second group of sub-operations to form the bottom electrode shroud. The first embodiment is discussed below with reference to FIGS. 4A-4D, and the second embodiment is discussed below with reference to FIGS. 5A-5C.

In accordance with the first embodiment of the present disclosure, the performance of operation 208 further includes covering the structure, including the bottom electrode as well as the lower level, with a second dielectric layer. In accordance with at least one embodiment, the second dielectric layer can be filled over the structure. For example, the second dielectric layer can be applied by flowable chemical vapor deposition (fCVD). The second dielectric layer is applied such that a portion of the second dielectric layer is arranged above the bottom electrode. In other words, the bottom electrode is covered by the second dielectric layer. In accordance with at least one embodiment, the second dielectric layer can be made of, for example, SiN, SiON, SiCOH, and metal oxides such as, for example, Al2O3, SiO2, and HfO2.

Figure 4A:
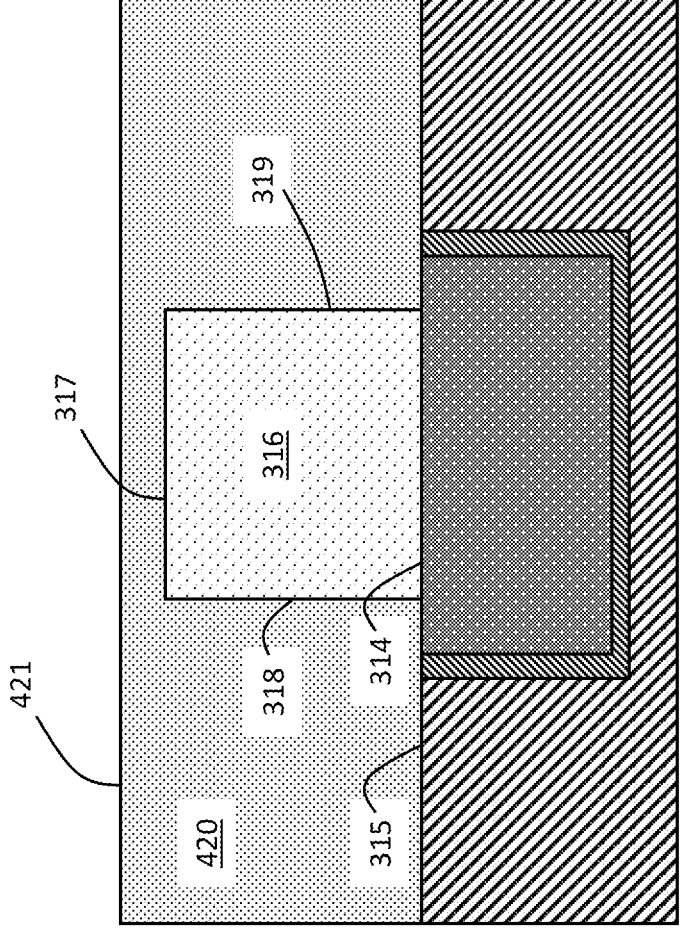
FIG. 4A illustrates an example of a component following the performance of a portion of the example method of FIG. 2, in accordance with embodiments of the present disclosure.

FIG. 4A depicts the example structure 300 following the performance of this portion of operation 208. As shown, the example structure 300 includes a second dielectric layer 420, which has been applied so as to cover the bottom electrode 316 as well as the lower level 302. The second dielectric layer 420 covers the uppermost surface 317 and the first and second sidewalls 318, 319 of the bottom electrode 316 such that the second dielectric layer 420 is in direct contact with the uppermost surface 317 and the first and second sidewalls 318, 319 of the bottom electrode 316. In particular, the second dielectric layer 420 covers the bottom electrode 316 such that an uppermost surface 421 of the second dielectric layer 420 is arranged higher than the uppermost surface 317 of the bottom electrode 316. Because both the second dielectric layer 420 and the bottom electrode 316 are formed on the lower level 302, a lowermost surface 314 of the bottom electrode 316 is substantially coplanar with a lowermost surface 315 of the second dielectric layer 420.

In accordance with the first embodiment of the present disclosure, the performance of operation 208 further includes forming an opening in the second dielectric layer to expose a portion of the uppermost surface of the bottom electrode. The portion of the uppermost surface of the bottom electrode that is exposed by the opening is less than the entire uppermost surface of the bottom electrode. In other words, the opening is not as wide as the bottom electrode. In particular, the opening is formed such that it is spaced apart from either of the side surfaces of the bottom electrode. As explained in further detail below, this arrangement of the opening spaced apart from the side surfaces of the bottom electrode enables the second dielectric layer to form the bottom electrode shroud by separating the side surfaces of the bottom electrode from the side surfaces of a metal core. In accordance with at least one embodiment, the opening can be formed by selectively patterning and etching the second dielectric layer.

Figure 4B:
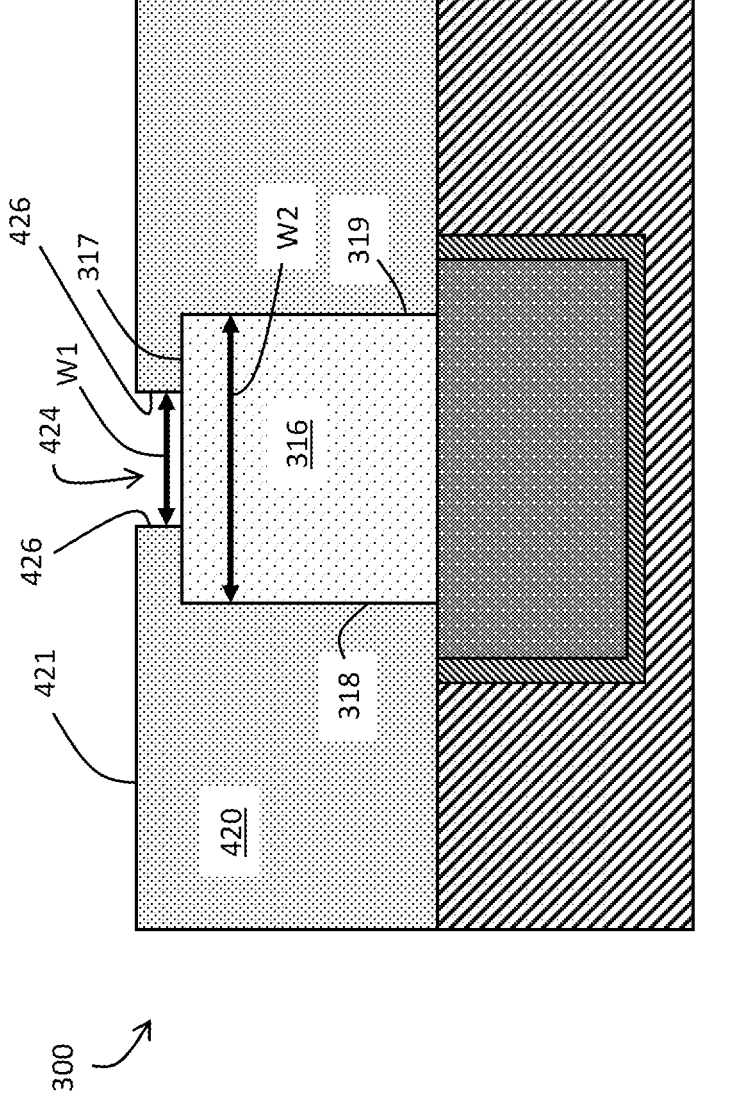
FIG. 4B illustrates an example of a component following the performance of a portion of the example method of FIG. 2, in accordance with embodiments of the present disclosure.

FIG. 4B depicts the example structure 300 following the performance of this portion of operation 208. As shown, an opening 424 has been formed through the thickness of the second dielectric layer 420 to expose a portion of the uppermost surface 317 of the bottom electrode 316. In other words, the opening 424 extends from the uppermost surface 421 of the second dielectric layer 420 to the uppermost surface 317 of the bottom electrode 316.

The opening 424 has a width W1 that is less than a width W2 of the bottom electrode 316. Moreover, the width W1 of the opening 424 is arranged relative to the width W2 of the bottom electrode 316 such that an amount of the second dielectric layer 420 separates each of the side surfaces 426 of the opening 424 from each of the sidewalls 318, 319 of the bottom electrode 316. In other words, neither of the side surfaces 426 of the opening 424 is substantially coplanar with either of the sidewalls 318, 319 of the bottom electrode 316.

In accordance with the first embodiment of the present disclosure, the performance of operation 208 further includes filling the opening with metal material to form a metal body, also referred to herein as a metal core, that is in direct contact with the uppermost surface of the bottom electrode. Accordingly, the metal material that fills the opening is in direct contact with the uppermost surface of the bottom electrode and extends through the thickness of the second dielectric layer to the uppermost surface of the dielectric layer.

In accordance with at least one embodiment, the metal material that forms the metal core can be a different metal than that used to form the bottom electrode. In accordance with at least one alternative embodiment, the metal material that forms the metal core can be the same as that used to form the bottom electrode. In accordance with at least one embodiment, the metal material that forms the metal core can be a metal nitride such as, for example, tantalum nitride, titanium nitride, or tungsten nitride.

In accordance with at least one embodiment, filling the opening with the metal material includes applying the metal material over the entire structure such that the metal material fills the opening and also forms a layer on top of the second dielectric layer. In such embodiments, the application of excess metal material helps to ensure that the opening is fully and completely filled by the metal material.

Figure 4C:
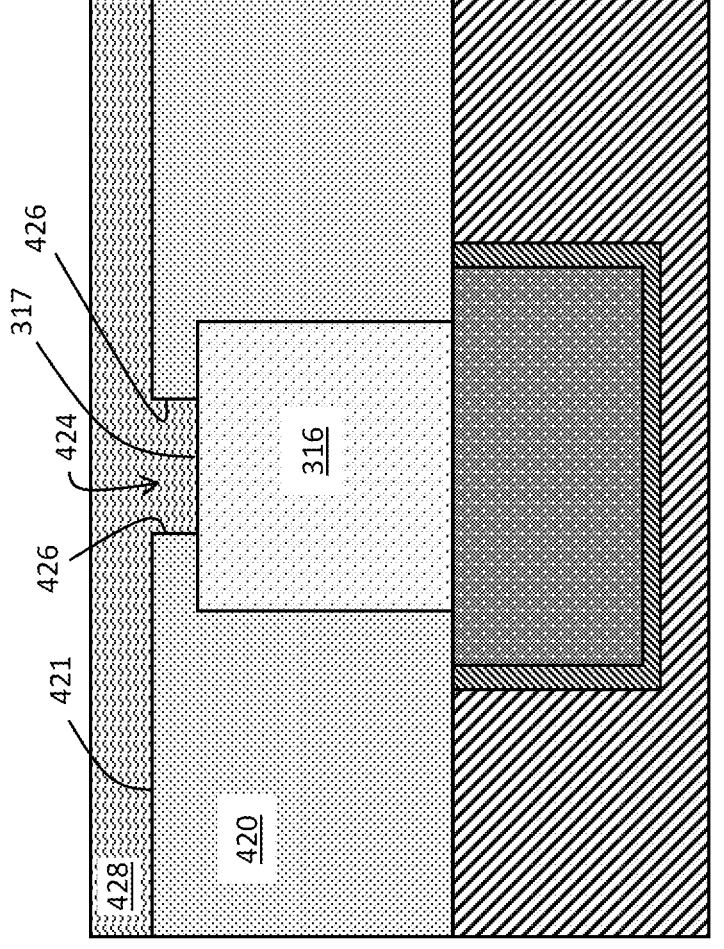
FIG. 4C illustrates an example of a component following the performance of a portion of the example method of FIG. 2, in accordance with embodiments of the present disclosure.
Figure 4C:
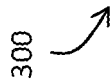

FIG. 4C depicts the example structure 300 following the performance of this portion of operation 208. As shown, the opening 424 has been filled with metal material 428 that also covers the second dielectric layer 420. The metal material 428 is in direct contact with the side surfaces 426 of the opening 424, with the uppermost surface 317 of the bottom electrode 316, and with the uppermost surface 421 of the second dielectric layer 420.

In accordance with the first embodiment of the present disclosure, the performance of operation 208 further includes planarizing the top of the structure to remove the excess metal material above the second dielectric layer as well as to provide a planar top surface of the structure for subsequent fabrication processes. In accordance with at least one embodiment, planarizing the top of the structure can be accomplished by performing a chemical mechanical planarization (CMP) procedure.

Following the removal of the excess metal material above the second dielectric layer, the only metal material that remains is that which forms the metal core, which is in direct contact with the bottom electrode. Together, the bottom electrode and the metal core provide a conductive contact for further structures to be arranged on top of the metal core. Because the metal core is narrower than the bottom electrode and the difference in widths between the metal core and the bottom electrode is filled with the second dielectric layer, the second dielectric layer forms a bottom electrode shroud that covers the uppermost surface of the bottom electrode except where the metal core is in direct contact with the bottom electrode. By forming such a bottom electrode shroud, the second dielectric layer prevents the uppermost surface of the bottom electrode from being inadvertently impacted by subsequent fabrication processes, such as etching. Accordingly, following the removal of the excess metal material, the bottom electrode shroud is formed, and the performance of operation 208, in accordance with the first illustrative embodiment of the present disclosure, is complete.

Figure 4D:
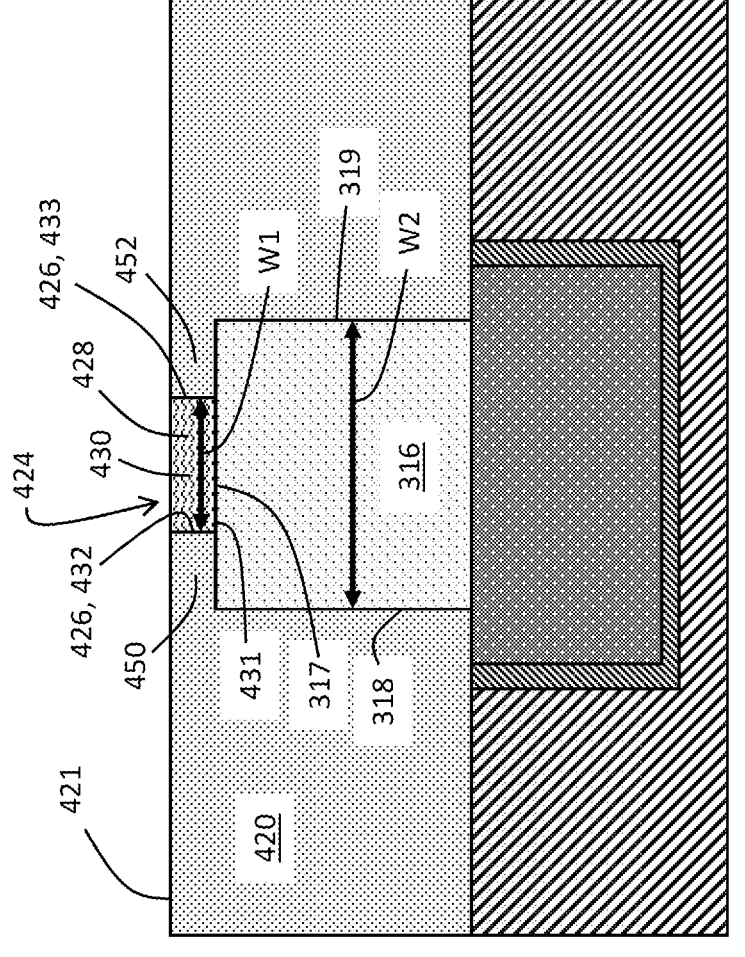
FIG. 4D illustrates an example of a component following the performance of a portion of the example method of FIG. 2, in accordance with embodiments of the present disclosure.
Figure 4D:
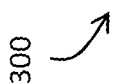

FIG. 4D depicts the example structure 300 following the performance of this portion of operation 208 (and, thus, following the performance of the entirety of operation 208). As shown, the metal material 428 has been removed except for where it forms the metal core 430 within the opening 424. The metal core 430 is in direct contact with the uppermost surface 317 of the bottom electrode 316 and with each of the side surfaces 426 of the opening 424. Accordingly, a lowermost surface 431 of the metal core 430 is in direct contact with the uppermost surface 317 of the bottom electrode 316. Furthermore, like the opening 424 that it filled, the metal core 430 extends through the second dielectric layer 420; from the uppermost surface 317 of the bottom electrode 316 to the uppermost surface 421 of the second dielectric layer 420.

Each sidewall 432, 433 of the metal core 430 is in direct contact with, and is coextensive with, a corresponding side surface 426 of the opening 424. Therefore, the metal core 430 has a width, extending from the sidewall 432 to the sidewall 433, that is substantially equal to the width W1 of the opening 424. Thus, like the opening 424, the metal core 430 has a width W1 that is less than the width W2 of the bottom electrode 316.

As shown, the width W1 of the metal core 430 is arranged relative to the width W2 of the bottom electrode 316 such that neither of the sidewalls 432, 433 of the metal core 430 is substantially coplanar with either of the sidewalls 318, 319 of the bottom electrode 316. In other words, the sidewall 432 of the metal core 430 is arranged laterally inwardly relative to the nearest sidewall 318 of the bottom electrode 316, and the sidewall 433 of the metal core 430 is arranged laterally inwardly relative to the nearest sidewall 319 of the bottom electrode 316. As used herein, the phrase "laterally inwardly" means nearer to the geometric centerline of the structure.

As a result of the relative arrangements of the widths W1, W2 of the metal core 430 and the bottom electrode 316, a first region 450 of the second dielectric layer 420 is partially delimited by the sidewall 432 of the metal core 430 and the uppermost surface 317 of the bottom electrode 316, and a second region 452 of the second dielectric layer 420 is partially delimited by the sidewall 433 of the metal core 430 and the uppermost surface 317 of the bottom electrode 316. As used herein, the phrase "delimited by" means bounded or limited by. Accordingly, the first region 450 is also in direct contact with the sidewall 432 and the uppermost surface 317, and the second region 452 is also in direct contact with the sidewall 433 and the uppermost surface 317. Together, the first and second regions 450, 452 of the second dielectric layer 420 form the bottom electrode shroud, because they protect the uppermost surface 317 of the bottom electrode 316 except for where the metal core 430 is in direct contact with the bottom electrode 316.

Returning to FIG. 2, as noted above, the performance of operation 208 can be achieved, alternatively, by performing a second group of sub-operations to form the bottom electrode shroud. This second group, which makes up a second embodiment of operation 208, is discussed below with reference to FIGS. 5A-5C. Many of the resulting structures and functions of each embodiment are substantially similar. Therefore, similar structures are indicated with similar reference numerals (e.g., 520 is substantially similar to 420).

In accordance with the second embodiment of the present disclosure, the performance of operation 208 further includes recessing the top corners of the bottom electrode relative to the uppermost surface of the bottom electrode. More specifically, material of the bottom electrode is removed from the lateral areas of the bottom electrode that are adjacent to each of the sidewalls of the bottom electrode and to the uppermost surface of the bottom electrode such that each resulting recessed lateral area has an uppermost surface that is lower than the uppermost surface of the bottom electrode. In accordance with at least one embodiment, the lateral areas can be recessed by selectively masking and etching the bottom electrode. For example, the lateral areas can be recessed by performing an IBE or RIE procedure on the bottom electrode. Alternatively, the lateral areas can be recessed by performing a different dry method or by wet removal of the bottom electrode.

Figure 5A:
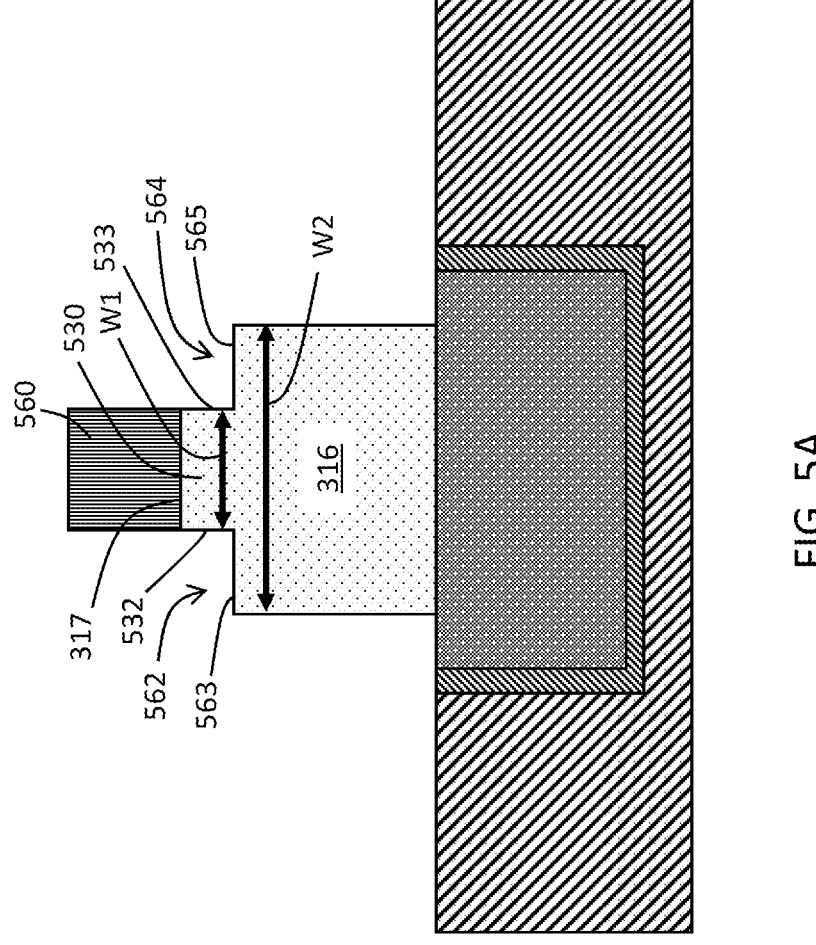
FIG. 5A illustrates an example of a component following the performance of a portion of the example method of FIG. 2, in accordance with embodiments of the present disclosure.

FIG. 5A depicts the example structure 300 following the performance of the above portion(s) of operation 208. In particular, FIG. 5A depicts a hardmask 560 that has been selectively applied to the uppermost surface 317 of the bottom electrode 316 such that unmasked areas of the uppermost surface 317 are etched to form recessed lateral areas 562, 564. Each of the recessed lateral areas 562, 564 has an uppermost surface 563, 565, respectively, that is lower than the uppermost surface 317 of the bottom electrode 316.

The un-recessed portion of the bottom electrode 316, between the recessed lateral areas 562, 564, forms a metal core 530 that is substantially similar to the metal core 430 described above with reference to FIGS. 4A-4D. Each of the recessed lateral areas 562, 564 forms a respective sidewall 532, 533 of the metal core 530. Accordingly, the metal core 530 has a width W1 (which is determined by the width of the hardmask 560), which extends from the sidewall 532 to the sidewall 533. The width W1 of the metal core 530 is less than the width W2 of the bottom electrode 316, and the width W1 is arranged relative to the width W2 such that neither of the sidewalls 532, 533 is substantially coplanar with either of the sidewalls 318, 319. Additionally, the sidewall 532 is arranged laterally inwardly relative to the corresponding sidewall 318, and the sidewall 533 is arranged laterally inwardly relative to the corresponding sidewall 319.

In the second embodiment, because the metal core 530 is formed from the bottom electrode 316, the metal material that forms the metal core 530 is the same as the metal material that forms the bottom electrode 316. In accordance with at least one embodiment, the material that forms both the bottom electrode 316 and the metal core 530 can be a metal nitride such as, for example, tantalum nitride, titanium nitride, or tungsten nitride. Additionally, in the second embodiment, the uppermost surface 317 of the bottom electrode 316 is also the uppermost surface of the metal core 530. As described herein, the metal core 530 may also be referred to as being in direct contact with the bottom electrode 316. In such instances, a plane that is substantially coplanar with that of the uppermost surfaces 563, 565 of each of the recessed lateral areas 562, 564 can be considered to be the uppermost surface of the bottom electrode 316. Furthermore, in such instances, the uppermost surface 317 of the entirety of the bottom electrode 316 can be considered to be the uppermost surface of the metal core 530.

In accordance with the second illustrative embodiment, the performance of operation 208 further includes covering the structure, including the bottom electrode as well as the lower level, with a second dielectric layer. The formation of the second dielectric layer in the second embodiment is substantially similar to the formation of the second dielectric layer discussed above with respect to the first embodiment. Accordingly, the second dielectric layer can be filled over the structure, for example, by fCVD. The second dielectric layer is applied such that a portion of the second dielectric layer is arranged above the bottom electrode. In other words, the bottom electrode is covered by the second dielectric layer. As noted above, the second dielectric layer can be made of, for example, SiN, SiON, SiCOH, and metal oxides such as, for example, Al2O3, SiO2, and HfO2.

Figure 5B:
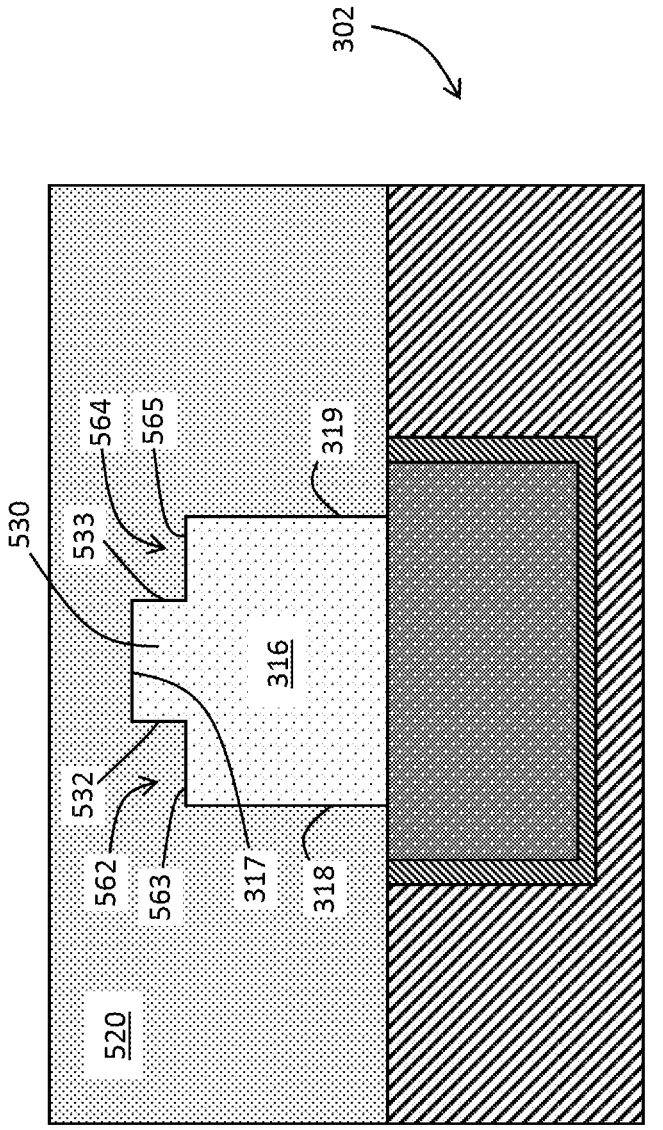
FIG. 5B illustrates an example of a component following the performance of a portion of the example method of FIG. 2, in accordance with embodiments of the present disclosure.

FIG. 5B depicts the example structure 300 following the performance of this portion of operation 208. As shown, the example structure 300 includes a second dielectric layer 520, which has been applied so as to cover the bottom electrode 316 as well as the lower level 302. The second dielectric layer 520 covers, and is in direct contact with, the uppermost surface 317 of the metal core 530 and the first and second sidewalls 318, 319 of the bottom electrode 316 such that an uppermost surface 521 of the second dielectric layer 520 is arranged higher than the uppermost surface 317. Additionally, because the metal core 530 has already been formed, the second dielectric layer 520 also covers, and is in direct contact with, the sidewalls 532, 533 of the metal core 530 and the uppermost surfaces 563, 565 of each of the recessed lateral areas 562, 564.

In the second embodiment, the performance of operation 208 further includes planarizing the top of the structure to remove excess dielectric material of the second dielectric layer that is arranged above the metal core as well as to provide a planar top surface of the structure for subsequent fabrication processes. In accordance with at least one embodiment, planarizing the top of the structure can be accomplished by performing a CMP procedure. In particular, the structure is planarized so as to expose the uppermost surface of the metal core that extends from the bottom electrode. In other words, the structure is planarized such that the uppermost surface of the second dielectric layer is made substantially coplanar with the uppermost surface of the metal core. As noted above, in the second embodiment, the uppermost surface of metal core is also the uppermost surface of the bottom electrode.

Figure 5C:
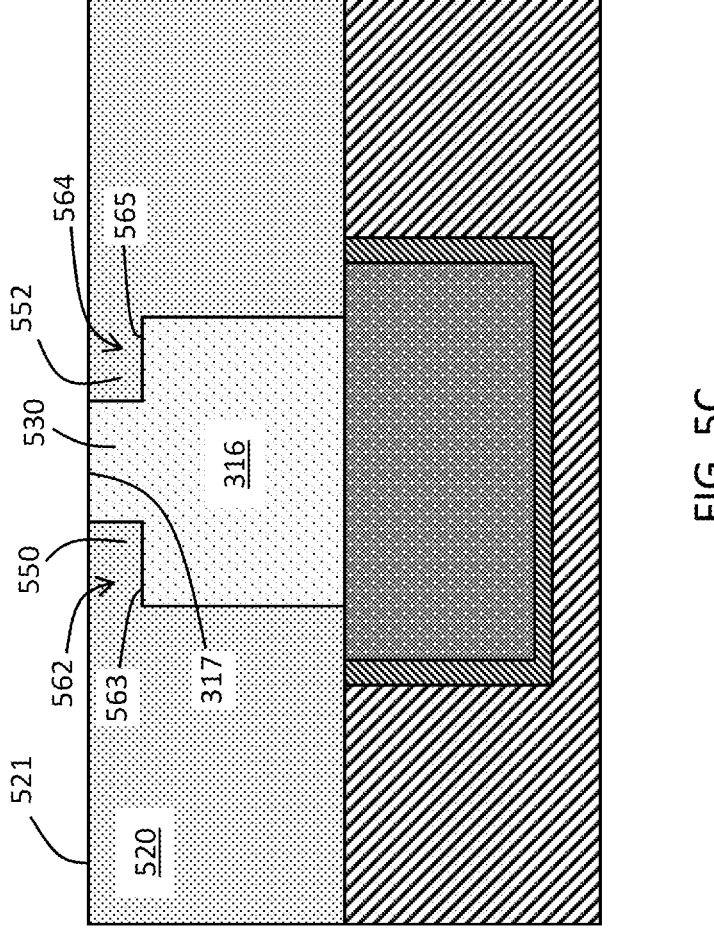
FIG. 5C illustrates an example of a component following the performance of a portion of the example method of FIG. 2, in accordance with embodiments of the present disclosure.

FIG. 5C depicts the structure 300 following the performance of this portion of operation 208. As shown, the structure 300 has been planarized such that the uppermost surface 317 of the metal core 530 is exposed and such that the uppermost surface 521 of the second dielectric layer 520 is made substantially coplanar with the uppermost surface 317 of the metal core 530. However, even after planarization, the uppermost surface 521 of the second dielectric layer 520 is still arranged higher than the uppermost surfaces 563, 565 of each of the recessed lateral areas 562, 564.

A first region 550 of the second dielectric layer 520 is formed where the second dielectric layer 520 is arranged above the uppermost surface 563 of the recessed lateral areas 562, and a second region 552 of the second dielectric layer 520 is formed where the second dielectric layer 520 is arranged above the uppermost surface 565 of the recessed lateral area 564. Together, the first and second regions 550, 552 of the second dielectric layer 520 form the bottom electrode shroud, because they protect the bottom electrode 316 except for where the metal core 530 is in direct contact with the bottom electrode 316.

As noted above, in the second embodiment, the metal core 530 extends from the bottom electrode 316, so the metal core 530 can be considered to be in direct contact with the bottom electrode 316 at an uppermost surface of the bottom electrode 316 that is considered to be defined along a plane that is substantially coplanar with that of the uppermost surfaces 563, 565 of each of the recessed lateral areas 562, 564. Therefore, this uppermost surface 317 of the bottom electrode 316 is protected by the bottom electrode shroud.

Together, the bottom electrode and the metal core provide a conductive contact for further structures to be arranged on top of the metal core. Because the metal core is narrower than the bottom electrode and the difference in widths between the metal core and the bottom electrode is filled with the second dielectric layer, the second dielectric layer forms a bottom electrode shroud that covers the uppermost surface of the bottom electrode except where the metal core is in direct contact with the bottom electrode. By forming such a bottom electrode shroud, the second dielectric layer prevents the uppermost surface of the bottom electrode from being inadvertently impacted by subsequent fabrication processes, such as etching. Accordingly, following the removal of the excess dielectric material of the second dielectric layer, the bottom electrode shroud is formed, and the performance of operation 208, in accordance with the first illustrative embodiment of the present disclosure, is complete.

Returning to FIG. 2, following the performance of operation 208, wherein the bottom electrode shroud is formed, the method 200 proceeds with operation 212, wherein the memory storage elements are formed. The memory storage elements may also be referred to herein as a memory component. In accordance with at least one embodiment of the present disclosure, the performance of operation 212 further includes the performance of a number of sub-operations.

The method 200 proceeds with operation 212 from the performance of either of the first and second embodiments of operation 208. The performance of operation 212 is the same in either case. One difference between the resulting structures is that performing operation 212 following the performance of the first embodiment of operation 208 will result in a metal core that can be formed of a different material than the bottom electrode while performing operation 212 following the performance of the second embodiment of operation 208 will result in a metal core that can only be formed of the same material as the bottom electrode. For illustrative purposes, the performance of operation 212 is discussed hereinafter with respect to the configuration of the structure (shown in FIG. 4D) produced by the performance of the first embodiment of operation 208.

In accordance with at least one embodiment of the present disclosure, the performance of operation 212 includes depositing layers on top of the structure that will be used to form memory storage elements. More specifically, the layers can be those that form an MTJ stack. Accordingly, the bottom layer of the MTJ stack is formed in direct contact with the uppermost surface of the metal core and with the uppermost surface of the second dielectric layer.

Figure 6A:
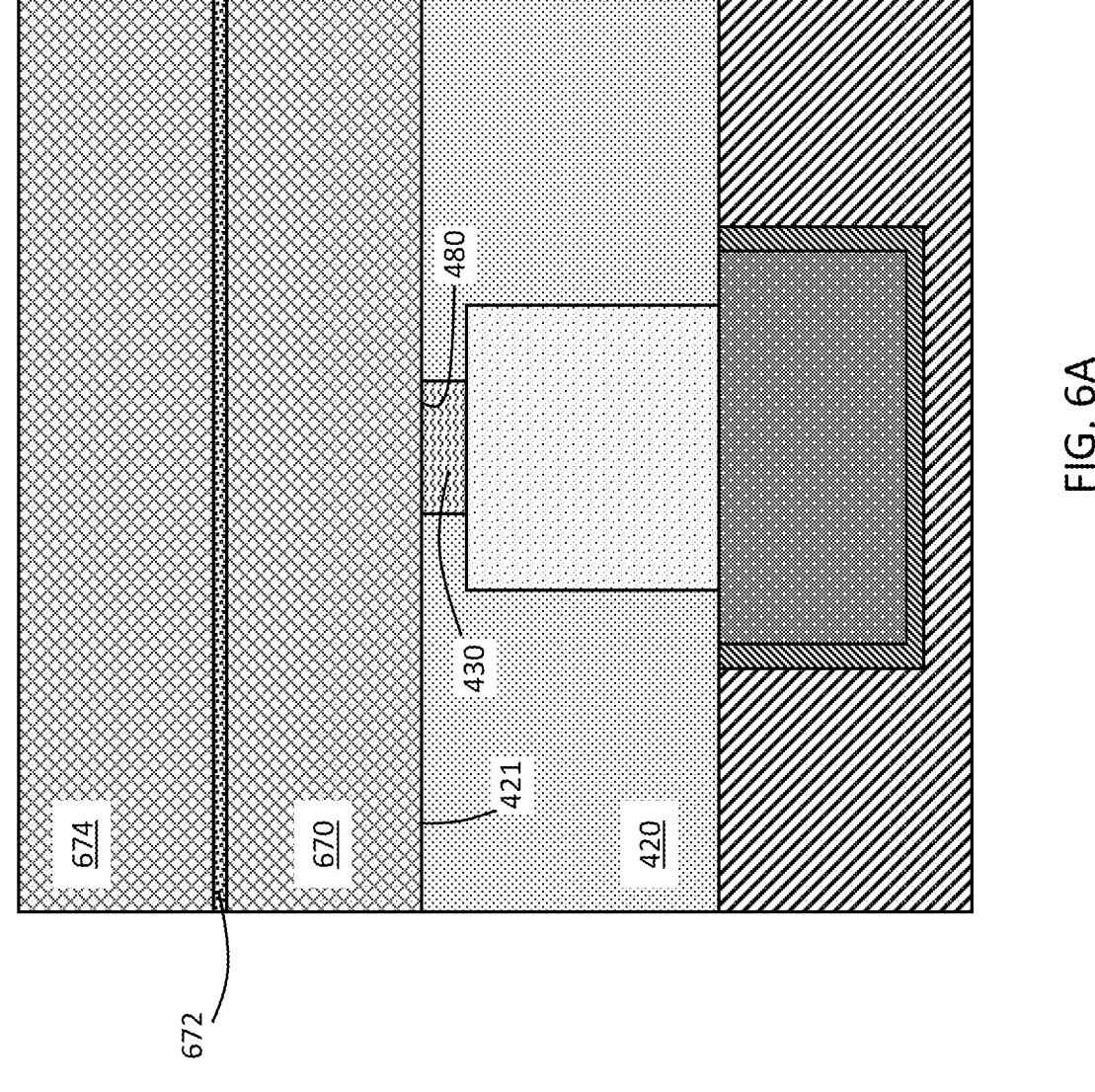
FIG. 6A illustrates an example of a component following the performance of a portion of the example method of FIG. 2, in accordance with embodiments of the present disclosure.

FIG. 6A depicts the structure 300 following the performance of this portion of operation 212. As shown, illustrative layers of materials 670, 672, 674 that will form the MTJ stack are deposited on top of the structure 300 such that a lowermost surface of the bottom layer 670 is in direct contact with an uppermost surface 480 of the metal core 430 and with the uppermost surface 421 of the second dielectric layer 420.

In accordance with at least one embodiment of the present disclosure, the performance of operation 212 further includes selectively patterning and etching the layers of materials that will form the MTJ stack. Etching the layers of materials that will form the MTJ stack can include, for example, performing an IBE or an RIE procedure. Typically, such procedures would inadvertently impact metal materials underlying the MTJ stack. For example, the bottom electrode underlying the bottom layer of the MTJ stack to provide electrical contact to the MTJ stack could be inadvertently impacted by an RIE etching procedure. However, in the present disclosure, such inadvertent impact is prevented by the bottom electrode shroud.

Figure 6B:
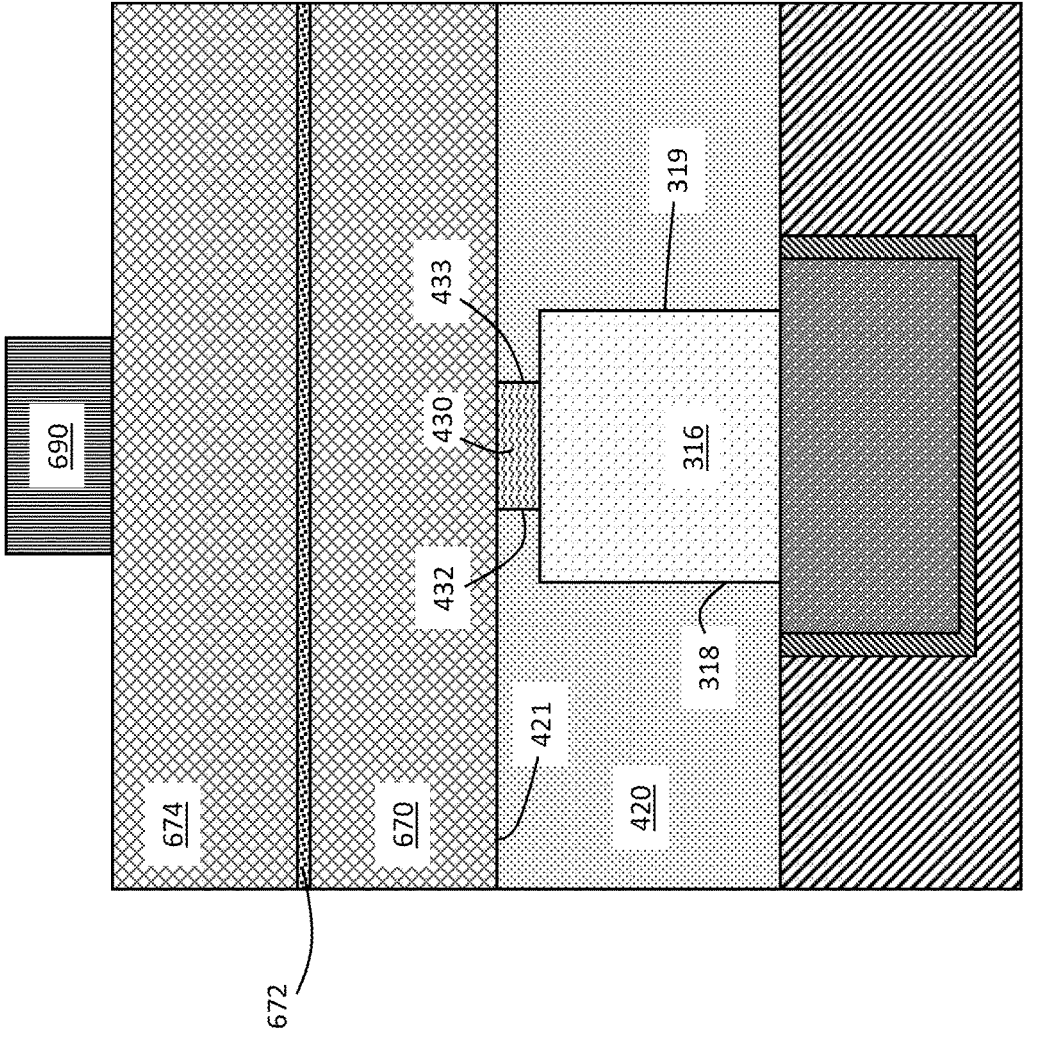
FIG. 6B illustrates an example of a component following the performance of a portion of the example method of FIG. 2, in accordance with embodiments of the present disclosure.

FIG. 6B depicts the structure 300 following the selective patterning of the layers 670, 672, 674 of materials that will form the MTJ stack in preparation for selectively etching the layers. As shown, a hardmask 690 is patterned on top of the top layer 674 so as to be aligned with the metal core 430. More specifically, the hardmask 690 is wider than the metal core 430 and narrower than the bottom electrode 316 and is arranged such that the layers 670, 672, 674 of materials will be etched to the uppermost surface 421 of the second dielectric layer 420 to an extent that is laterally outwardly of the sidewalls 432, 433 of the metal core 430 and laterally inwardly of the sidewalls 318, 319 of the bottom electrode 316.

Figure 6C:
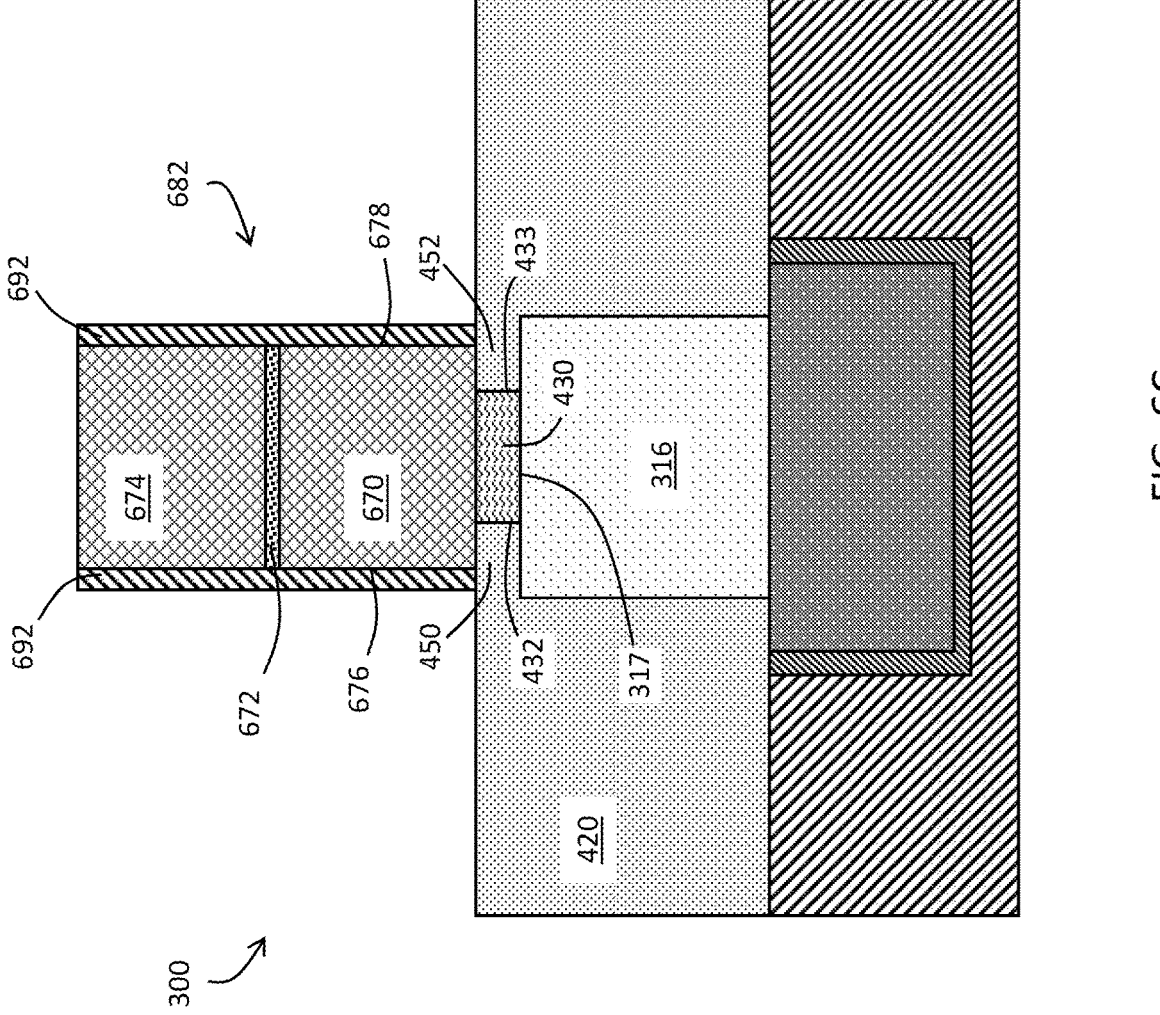
FIG. 6C illustrates an example of a component following the performance of a portion of the example method of FIG. 2, in accordance with embodiments of the present disclosure.

FIG. 6C depicts the structure 300 following the selective etching of the layers 670, 672, 674 wherever the hardmask 690 (shown in FIG. 6B) was not arranged covering the top layer 674. As shown, the sidewalls 676, 678 of the resulting MTJ stack 682 are substantially vertically aligned with the first and second regions 450, 452 of the second dielectric layer 420. Therefore, any underlying material beneath the MTJ layers 670, 672, 674 that is inadvertently impacted during the etching procedure is dielectric material rather than metal material. Thus, any re-sputtering of metal material onto the sidewalls 676, 678 of the MTJ stack 682 is prevented, which prevents shorting the memory device.

As shown in FIG. 6C, when the memory device is completely formed, the first region 450 of the second dielectric layer 420 is partially delimited by the sidewall 432 of the metal core 430, the uppermost surface 317 of the bottom electrode 316, and the lowermost surface of the bottom layer 670 of the MTJ stack 682. Likewise, the second region 452 of the second dielectric layer 420 is partially delimited by the sidewall 433 of the metal core 430, the uppermost surface 317 of the bottom electrode 316, and the lowermost surface of the bottom layer 670 of the MTJ stack 682.

In accordance with at least one embodiment of the present disclosure, the performance of operation 212 further includes forming a dielectric cap on each of the sidewalls of the MTJ stack following the etching procedure. FIG. 6C depicts the structure 300 including such a dielectric cap 692 formed on each of the sidewalls 676, 678 of the MTJ stack 682. Accordingly, FIG. 6C depicts the example structure 300 following the performance of the entirety of the method 200.

In addition to embodiments described above, other embodiments having fewer operational steps, more operational steps, or different operational steps are contemplated. Also, some embodiments may perform some or all of the above operational steps in a different order. Furthermore, multiple operations may occur at the same time or as an internal part of a larger process.

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s).

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used, and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks.

When different reference numbers comprise a common number followed by differing letters (e.g., 100*a*, 100*b*, 100*c*) or punctuation followed by differing numbers (e.g., 100-1, 100-2, or 100.1, 100.2), use of the reference character only without the letter or following numbers (e.g., 100) may refer to the group of elements as a whole, any subset of the group, or an example specimen of the group.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the invention.

What is claimed is:

1. A memory device, comprising:
a lower level line in a lower dielectric layer, wherein a top surface of the lower level line and a top surface of the lower dielectric layer are substantially coplanar;
a bottom electrode composed of a first conductive material in electrical contact with the lower level line, the bottom electrode having an uppermost surface, a first sidewall, and a second sidewall;
a dielectric layer upon the lower dielectric layer, the dielectric layer directly upon the uppermost surface and directly upon the first and second sidewalls of the bottom electrode such that an uppermost surface of the dielectric layer is arranged higher than the uppermost surface of the bottom electrode;
a metal body composed of a second conductive material different from the first conductive material in direct contact with the uppermost surface of the bottom electrode and inset between the first sidewall and the second sidewall, the metal body further extending through the dielectric layer to the uppermost surface of the dielectric layer such that the dielectric layer shrouds a side perimeter of the metal body; and
a magnetic tunnel junction memory component comprising a bottom ferromagnetic plate, a top ferromagnetic plate, and an insulating layer between the bottom ferromagnetic plate and the top ferromagnetic plate, the bottom ferromagnetic plate arranged in direct contact with the metal body and in direct contact with the uppermost surface of the dielectric layer, wherein the metal body is inset between respective sidewalls of the magnetic tunnel junction memory component.

2. The memory device of claim 1, wherein:
a lowermost surface of the bottom electrode is substantially coplanar with a lowermost surface of the dielectric layer.

3. The memory device of claim 1, wherein:
the dielectric layer is in direct contact with the uppermost surface, the first sidewall, and the second sidewall of the bottom electrode.

4. The memory device of claim 1, wherein:
the magnetic tunnel junction memory component is separated from the uppermost surface of the bottom electrode by the dielectric layer and by the metal body.

5. The memory device of claim 1, wherein:
a width of the bottom electrode extends from the first sidewall of the bottom electrode to the second sidewall of the bottom electrode;
a width of the metal body extends from a first sidewall of the metal body to a second sidewall of the metal body; and
the width of the metal body is less than the width of the bottom electrode.

6. The memory device of claim 5, wherein:
neither of the first and second sidewalls of the bottom electrode is substantially coplanar with either of the first and second sidewalls of the metal body.

7. The memory device of claim 5, wherein:
the first sidewall of the metal body is arranged laterally inwardly relative to the first sidewall of the bottom electrode; and
the second sidewall of the metal body is arranged laterally inwardly relative to the second sidewall of the bottom electrode.

8. The memory device of claim 7, wherein:
a first region of the dielectric layer is in direct contact with the first sidewall of the metal body, the uppermost surface of the bottom electrode, and a lowermost surface of the magnetic tunnel junction memory component such that the first region is interposed between the uppermost surface of the bottom electrode and the lowermost surface of the magnetic tunnel junction memory component; and
a second region of the dielectric layer is in direct contact with the second sidewall of the metal body, the uppermost surface of the bottom electrode, and the lowermost surface of the magnetic tunnel junction memory component such that the second region is interposed between the uppermost surface of the bottom electrode and the lowermost surface of the magnetic tunnel junction memory component.

9. A method of making memory device, the method comprising:
forming a lower level line in a lower dielectric layer, wherein a top surface of the lower level line and a top surface of the lower dielectric layer are substantially coplanar;
forming a bottom electrode composed of a first conductive material upon the lower level line, the bottom electrode having an uppermost surface, a first sidewall, and a second sidewall;
forming a dielectric layer directly upon the uppermost surface and directly upon the first and second sidewalls of the bottom electrode such that an uppermost surface of the dielectric layer is arranged higher than the uppermost surface of the bottom electrode;
forming a metal body composed of a second conductive material different from the first conductive material in direct contact with the uppermost surface of the bottom electrode and inset between the first sidewall and the second sidewall, the metal body further extending through the dielectric layer to the uppermost surface of the dielectric layer such that the dielectric layer shrouds a side perimeter of the metal body; and
forming a magnetic tunnel junction memory component comprising a bottom ferromagnetic plate, a top ferromagnetic plate, and an insulating layer between the bottom ferromagnetic plate and the top ferromagnetic plate, the bottom ferromagnetic plate arranged in direct contact with the metal body and in direct contact with the uppermost surface of the dielectric layer, wherein the metal body is inset between respective sidewalls of the magnetic tunnel junction memory component.

10. The method of claim 9, wherein:

forming the metal body includes:

forming an opening in the dielectric layer above the bottom electrode; and filling the opening with metal.

11. The method of claim 10, wherein:

forming the opening includes forming the opening such that a width of the opening is narrower than a width of the bottom electrode.

12. A memory device, comprising:

a lower level line in a lower dielectric layer, wherein a top surface of the lower level line and a top surface of the lower dielectric layer are substantially coplanar;

a bottom electrode composed of a first conductive material in electrical contact with the lower level line, the bottom electrode having an uppermost surface, a first sidewall, and a second sidewall;

a dielectric layer upon the lower dielectric layer, the dielectric layer directly upon the uppermost surface and directly upon the first and second sidewalls of the bottom electrode such that an uppermost surface of the dielectric layer is arranged higher than the uppermost surface of the bottom electrode;

a metal body composed of a second conductive material different from the first conductive material in direct contact with the uppermost surface of the bottom electrode and inset between the first sidewall and the second sidewall, the metal body further extending through the dielectric layer to the uppermost surface of the dielectric layer, wherein the dielectric layer forms a bottom electrode shroud around the metal body by electrically separating the first and second sidewalls of the bottom electrode from one or more side surface(s) of the metal body; and a magnetic tunnel junction memory component comprising a bottom ferromagnetic plate, a top ferromagnetic plate, and an insulating layer between the bottom ferromagnetic plate and the top ferromagnetic plate, the bottom ferromagnetic plate, the bottom ferromagnetic plate arranged in direct contact with the metal body and in direct contact with the uppermost surface of the dielectric layer, wherein the metal body is inset between respective sidewalls of the magnetic tunnel junction memory component.

13. The memory device of claim 12, wherein:

a lowermost surface of the bottom electrode is substantially coplanar with a lowermost surface of the dielectric layer.

14. The memory device of claim 12, wherein:

the dielectric layer is in direct contact with the uppermost surface, the first sidewall, and the second sidewall of the bottom electrode.

* * * * *